US010910055B2

(12) United States Patent
Igaue

(10) Patent No.: US 10,910,055 B2
(45) Date of Patent: Feb. 2, 2021

(54) SYSTEM AND METHOD FOR REDUCING POWER CONSUMPTION OF MEMORY DEVICE

(71) Applicant: RENESAS ELECTRONICS CORPORATION, Tokyo (JP)

(72) Inventor: Futoshi Igaue, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/137,305

(22) Filed: Sep. 20, 2018

(65) Prior Publication Data

US 2019/0164608 A1 May 30, 2019

(30) Foreign Application Priority Data

Nov. 29, 2017 (JP) ................. 2017-229304

(51) Int. Cl.
| | | |
|---|---|---|
| *G11C 15/04* | (2006.01) |
| *G11C 29/44* | (2006.01) |
| *G11C 29/38* | (2006.01) |
| *G11C 29/00* | (2006.01) |
| *G11C 29/02* | (2006.01) |

(52) U.S. Cl.
CPC ............ *G11C 15/04* (2013.01); *G11C 29/025* (2013.01); *G11C 29/38* (2013.01); *G11C 29/44* (2013.01); *G11C 29/4401* (2013.01); *G11C 29/70* (2013.01); *G11C 2029/4402* (2013.01)

(58) Field of Classification Search
CPC ....... G11C 15/04; G11C 29/025; G11C 29/70; G11C 29/4401; G11C 29/38; G11C 29/44; G11C 2029/4402
See application file for complete search history.

(56) References Cited

U.S. PATENT DOCUMENTS

| | | | | |
|---|---|---|---|---|
| 5,905,668 A * | 5/1999 | Takahashi | ............... | G11C 15/04 365/49.1 |
| 6,609,222 B1 * | 8/2003 | Gupta | ........................ | G06F 7/74 714/733 |
| 6,738,278 B2 * | 5/2004 | Kim | ..................... | G06F 12/0895 365/189.05 |
| 7,017,089 B1 * | 3/2006 | Huse | ...................... | G11C 15/00 365/49.18 |
| 7,219,276 B2 * | 5/2007 | Mantri | ................... | G11C 15/00 365/201 |
| 7,920,398 B1 * | 4/2011 | Khanna | .................. | G11C 15/04 365/49.1 |
| 8,023,301 B1 * | 9/2011 | Srinivasan | ............. | G11C 15/04 365/49.1 |

(Continued)

*Primary Examiner* — Vanthu T Nguyen
(74) *Attorney, Agent, or Firm* — McDermott Will & Emery LLP

(57) ABSTRACT

The present invention provides a semiconductor device that can reduce the power consumption, including: a plurality of search memory cells arranged in a matrix; a plurality of match lines provided corresponding to each memory cell row to determine match/mismatch between data stored in the search memory cell and search data; a plurality of match line retention circuits provided corresponding to each of the match lines; a storage unit for storing information relating to the state of each of the match lines; and a selection circuit for selectively activating the match line retention circuits based on the information stored in the storage unit.

11 Claims, 14 Drawing Sheets

(56) References Cited

U.S. PATENT DOCUMENTS

| | | | | |
|---|---|---|---|---|
| 8,031,503 B1 * | 10/2011 | Gyllenhammer | ...... | G11C 15/04 |
| | | | | 365/49.1 |
| 8,587,979 B2 * | 11/2013 | Gronlund | ............... | G11C 15/04 |
| | | | | 365/227 |
| 8,837,188 B1 * | 9/2014 | Krishnamurthy | .... | G11C 15/046 |
| | | | | 365/49.1 |

* cited by examiner

| SRAM CELL (X CELL) | SRAM CELL (Y CELL) | TCAM CELL DATA |
|---|---|---|
| "1" | "0" | "0" |
| "0" | "1" | "1" |
| "0" | "0" | "*" (don't care) |
| "1" | "1" | NOT USED |

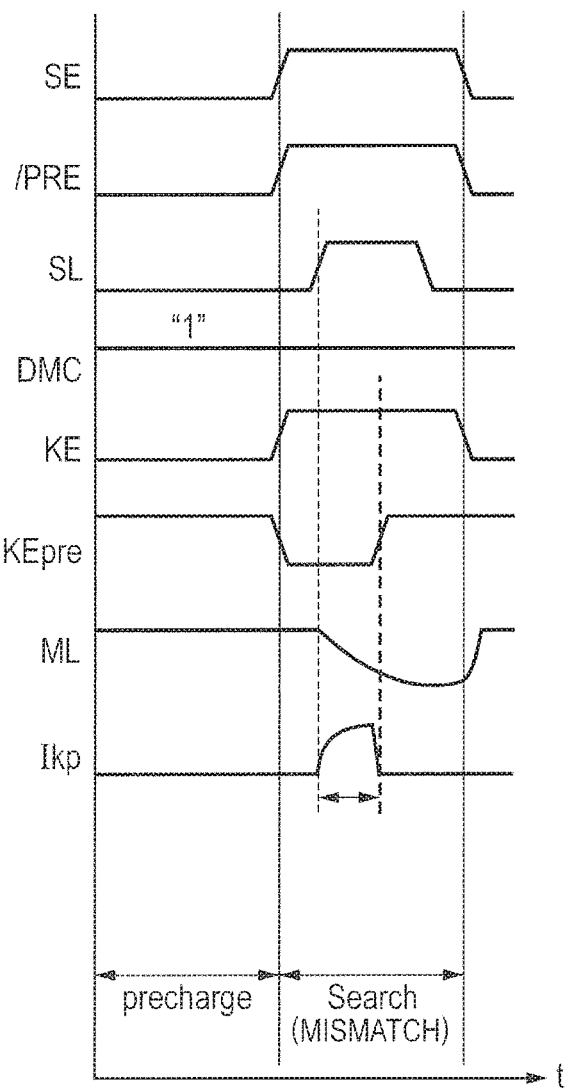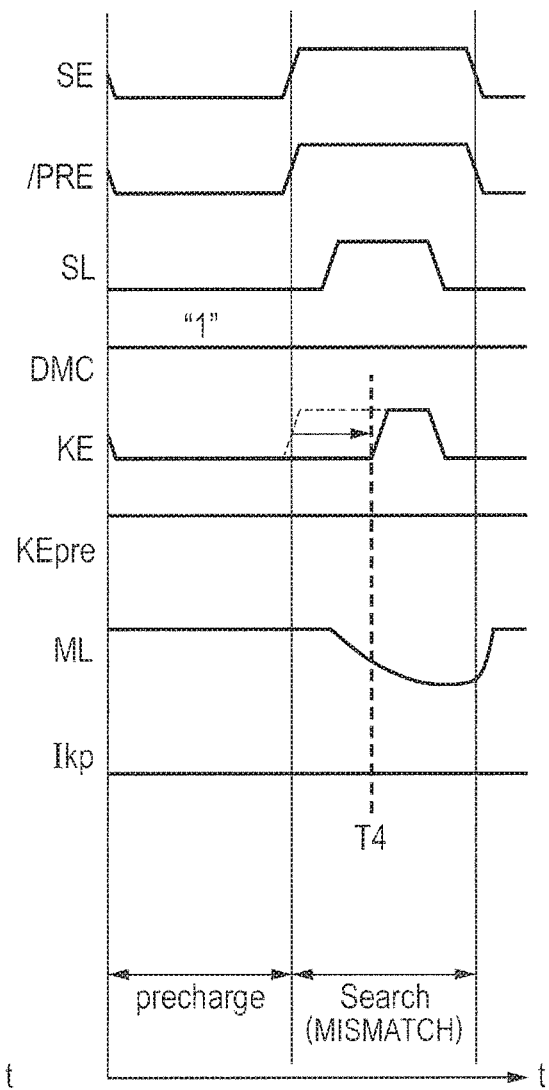

SYSTEM AND METHOD FOR REDUCING POWER CONSUMPTION OF MEMORY DEVICE

CROSS-REFERENCE TO RELATED APPLICATIONS

The disclosure of Japanese Patent Application No. 2017-229304 filed on Nov. 29, 2017 including the specification, drawings and abstract is incorporated herein by reference in its entirety.

BACKGROUND

The present invention relates to a semiconductor device and relates, for example, to an associative memory.

The storage device called associative memory or CAM (Content Addressable Memory) that is a device that searches for words matching a keyword from stored data words, and when finding a matching data word, outputs the address.

There are two types of CAM: BCAM (Binary CAM) and TCAM (Ternary CAM). Each memory cell of BCAM stores information of "0" or "1". On the other hand, in the case of TCAM, each memory cell can store information of "Don't Care" (for which "*" is used in this example) in addition to "0" and "1". The "*" mark indicates that both "0" and "1" are acceptable.

The TCAM device is widely used for address search and access control in network routers such as the Internet. In order to cope with increasing capacity requirements, in general, the TCAM device has a plurality of arrays to perform search operations simultaneously on each of the arrays.

The TCAM device can simultaneously compare input search data (input packet) with TCAM cell data and is faster than RAM (Random Access Memory) in all search applications.

More specifically, the TCAM device includes a match line (ML) for comparing data that the user wants to search and information stored in a memory cell to show match or mismatch between the two data.

In general, the match line is set to a power supply voltage (VDD) before search operation. When matched in a search operation, the match line is kept at the power supply voltage (VDD) level, and when not matched, the match line changes to a ground voltage (VSS) level.

On the other hand, with the increase in transistor leakage associated with the refinement of the semiconductor process, and due to manufacturing dispersion of transistors for data comparison as well as changes in off leakage due to aging degradation, there is a problem that the yield is reduced due to the degradation of the retention characteristics of the power supply voltage (VDD) of the match line, namely, the "H" level state.

In this regard, a voltage retention circuit that supports voltage change in the match line in search operation in terms of a circuit is proposed as an improvement of the retention characteristics of the potential of the match line (Patent Document 1: U.S. Pat. No. 7,920,398).

SUMMARY

However, the voltage retention circuit can improve the retention characteristics of the match line, but has a problem that the power consumption increases because shoot-through current occurs in mismatching entries in search operation.

The present disclosure has been made to solve the above problem and provides a semiconductor device that can reduce power consumption.

The above and other objects and novel features of the present invention will be apparent from the description of the present specification and the accompanying drawings.

A semiconductor device according to an aspect includes a plurality of search memory cells arranged in a matrix, and a plurality of match lines that are provided corresponding to each memory cell row to determine match or mismatch between data stored in the search memory cell and search data. Further, the semiconductor device also includes a plurality of match line retention circuits that are provided corresponding to each of the match lines, a storage unit for storing information relating to the state of each of the match lines, and a selection circuit for selectively activating the match line retention circuits based on the information stored in the storage unit.

According to an embodiment, the semiconductor device of the present disclosure can reduce power consumption.

BRIEF DESCRIPTION OF THE DRAWINGS

FIGS. 11A and 11B are diagrams showing the search operation based on the forth embodiment;

DETAILED DESCRIPTION

Figure 1:
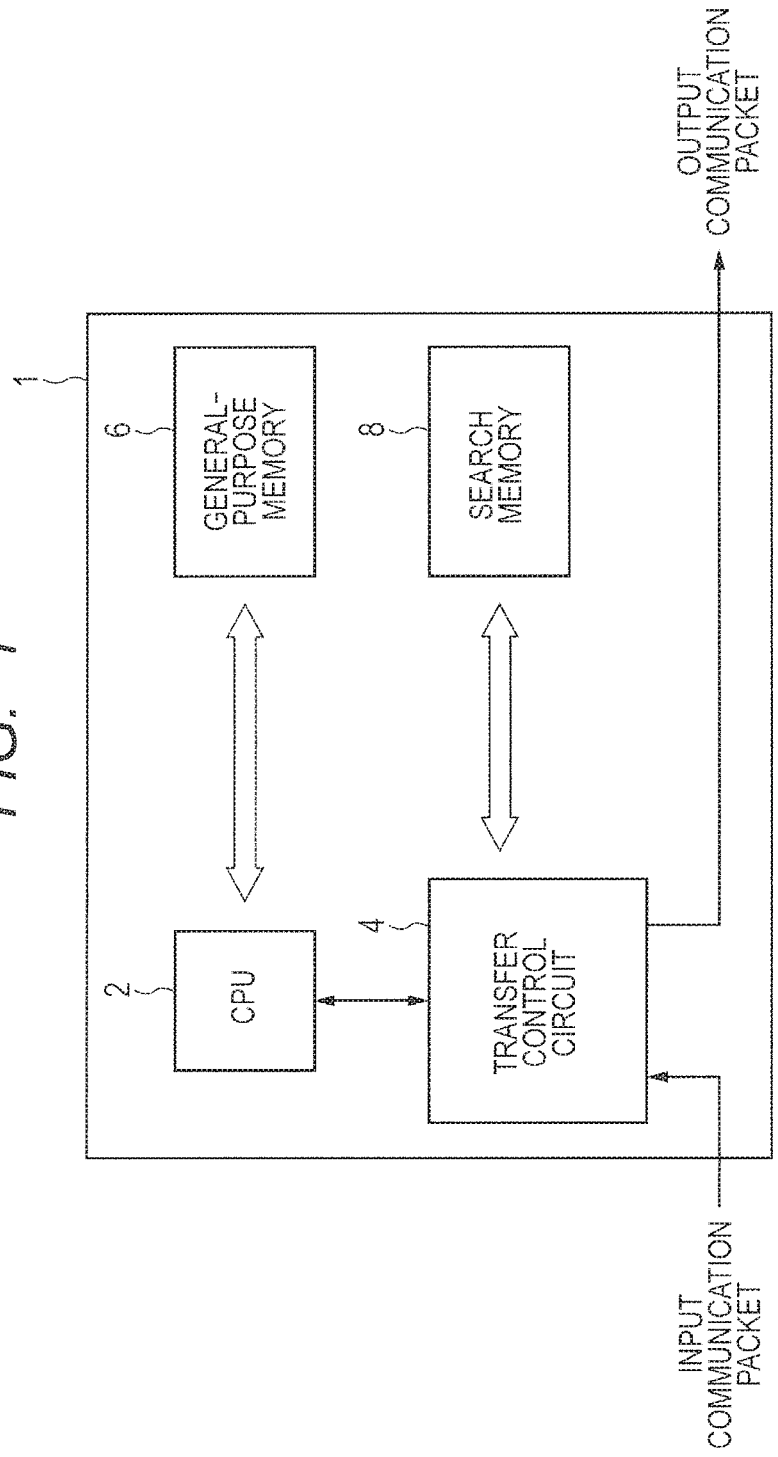
FIG. 1 is a diagram showing the configuration of a communication device 1 based on a first embodiment.

Preferred embodiments of the present invention will be described in detail with reference to the accompanying drawings. It is to be noted that like or corresponding parts are designated by like reference numerals throughout the accompanying drawings, and thus their description will not be repeated.

First Embodiment

<Entire Configuration of Communication Device 1>

FIG. 1 is a diagram showing the configuration of a communication device 1 based on a first embodiment.

As shown in FIG. 1, the communication device 1 is a communication device such as a switch or a router.

The communication device 1 includes a CPU (Central Processing Unit) 2, a transfer control circuit 4, a general-purpose memory 6, and a search memory 8.

The CPU 2 controls the entire device.

The CPU 2 implements various functions in cooperation with programs stored in the general-purpose memory 6. For example, the general-purpose memory 6 can be configured with DRAM (Dynamic Random Access Memory) to build an operating system (OS) in cooperation with the CPU 2. The CPU 2 maintains and manages information required for transfer processing by exchanging information with adjacent communication devices, and the like.

The transfer control circuit 4 performs transfer processing of communication packets. The transfer control circuit 4 is provided with dedicated hardware such as ASIC (Application Specific Integrated Circuit) circuit dedicated to transfer processing or NPU (Network Processing Unit). The transfer control circuit 4 accesses the search memory 8 to obtain the information required for transfer processing.

This example describes a case in which the search memory 8 uses a TCAM device.

[Configuration of TCAM Cell]

Figures 2, 3:
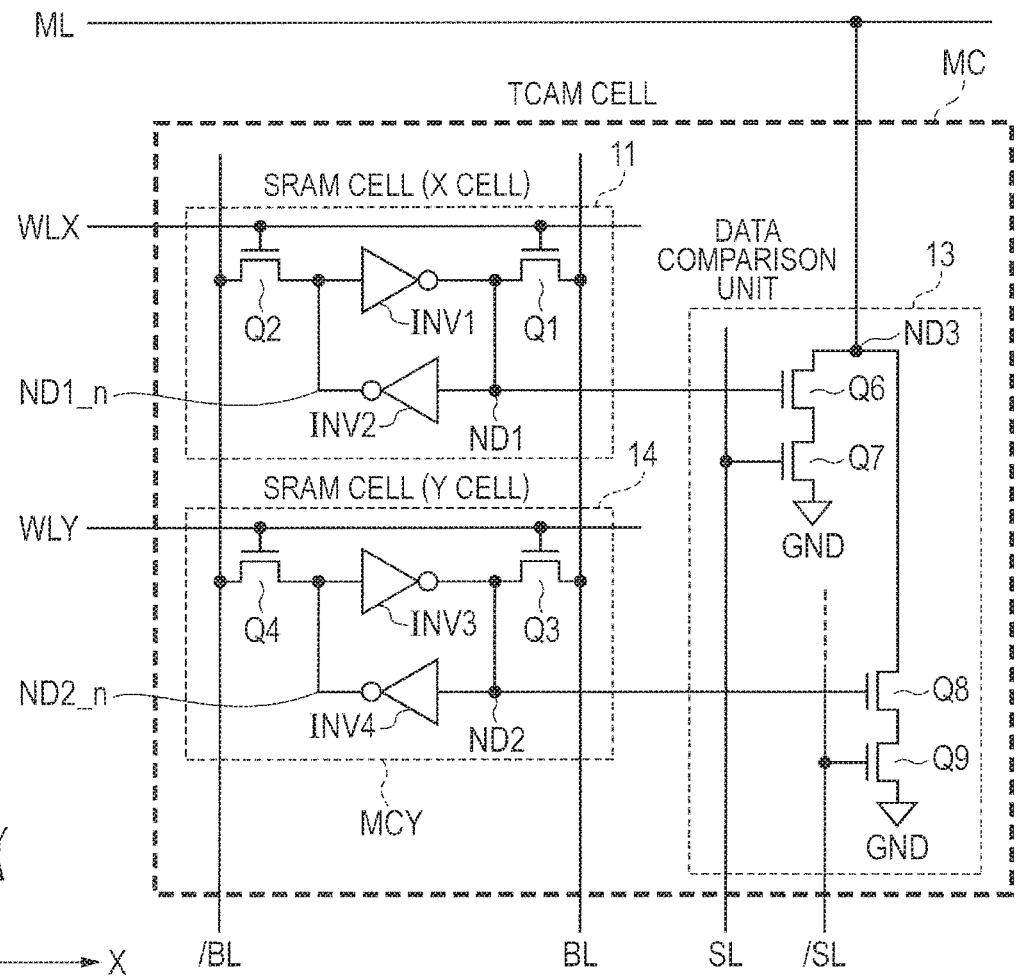
FIG. 2 is a circuit diagram showing an example of the configuration of a TCAM cell.
FIG. 3 is a view showing the correspondence between the stored contents of X and Y cells and TCAM data shown in FIG. 2.

FIG. 2 is a circuit diagram showing an example of the configuration of a TCAM cell.

Referring to FIG. 2, a TCAM cell (also referred to as a memory cell MC) includes two SRAM (Static Random Access Memory) cells 11 and 12, and a data comparison unit 13. The SRAM cell 11 is also referred to as the X cell and the SRAM cell 14 is also referred to as the Y cell. The X cell 11 stores 1 bit data that are complementary to each other (when one is "1", the other is "0") with respect to an internal memory node pair (ND1, ND1_n). The Y cell 14 stores 1 bit data that are complementary to each other with respect to an internal memory node pair (ND2, ND2_n). The TCAM cell is also referred to as the associative memory cell.

The TCAM cell is coupled to a bit line pair (BL, /BL), a search line pair (SL, /SL), a match line ML, and word lines WLX and WLY. The bit line pair (BL, /BL) extends in the column direction (Y direction) of the TCAM cell array 20 shown in FIG. 6, which is shared by a plurality of TCAM cells arranged in the column direction. The search line pair (SL, /SL) extends in the column direction (Y direction) of the TCAM cell array 20, which is shared by a plurality of TCAM cells arranged in the column direction.

The match line ML extends in the row direction (X direction) of the TCAM cell array 20, which is shared by a plurality of TCAM cells arranged in the row direction. The word lines WLX and WLY extend in the row direction (X direction) of the TCAM cell array 20, which are shared by the TCAM cells arranged in the row direction.

The X cell 11 includes inverters INV1 and INV2 as well as N-channel MOS (Metal Oxide Semiconductor) transistors Q1 and Q2. The inverter INV1 is coupled between the storage node ND1 and the storage node ND1_n in such a way that the direction from the storage node ND1_n to the storage node ND1 is forward direction. The inverter INV2 is coupled in parallel to the INV1 in the opposite direction. The MOS transistor Q1 is coupled between the storage node ND1 and the bit line BL. The MOS transistor Q2 is coupled between the storage node ND1_n and the bit line /BL. The gates of the MOS transistors Q1 and Q2 are coupled to the word line WLX.

The Y cell 14 includes inverters INV3 and INV4 as well as MOS (Metal Oxide Semiconductor) transistors Q3 and Q4. The inverter INV3 is coupled between the storage node ND2 and the storage node ND2_n in such a way that the direction from the strange node ND2_n to the storage node ND2 is forward direction. The inverter INV4 is coupled in parallel to INV3 in the opposite direction. The MOS transistor Q3 is coupled between the storage node ND2 and the bit line BL, and the MOS transistor Q4 is coupled between the storage node ND2_n and the bit line /BL. The gates of the MOS transistors Q3 and Q4 are coupled to the word line WLY.

The data comparison unit 13 includes N-channel MOS transistors Q6 to Q9. The MOS transistors Q6 and Q7 are coupled in series between the node ND3, which is the connecting point to the match line ML, and the ground node GND. The MOS transistors Q8 and Q9 are coupled in series between the node ND3 and the ground node GND, and at the same time, in parallel to the whole of the MOS transistors Q6 and Q7 that are coupled in series. The gates of the MOS transistors Q6 and Q8 are coupled to the storage nodes ND1 and ND2, respectively. The gates of the MOS transistors Q7 and Q9 are coupled to the search lines SL and /SL, respectively.

FIG. 3 is a view showing the correspondence, in tabular form, between the stored contents of X and Y cells and TCAM data shown in FIG. 2.

Referring to FIGS. 2 and 3, the TCAM cell can store three values of "0", "1", and "*" (don't care) by using 2 bit SRAM cells. More specifically, it is assumed that when "1" is stored in the storage node ND1 of the X cell 11 and "0" is stored in the storage node ND2 of the Y cell 14, "0" is stored in the TCAM cell. It is assumed that when "0" is stored in the storage node ND1 of the X cell 11 and "1" is stored in the storage node ND2 of the Y cell 14, "1" is stored in the TCAM cell. It is assumed that when "0" is stored in the storage node ND1 of the X cell 11 and "0" is stored in the storage node ND2 of the Y cell 14, "*" (don't care) is stored in the TCAM cell. In the case when "1" is stored in the storage node ND1 of the X cell 11 and "1" is stored in the storage node ND2 of the Y cell 14, the TCAM cell data is not used.

According to the configuration of the TCAM cell described above, when the search data is "1" (namely, the search line SL is "1" and the search line /SL is "0") and the TCAM data is "0" (the storage node ND1 is "1" and the storage node ND2 is "0"), the MOS transistors Q6 and Q7 are turned on. As a result, the potential of the precharged match line ML is pulled down to the ground potential. When the search data is "0" (namely, the search line SL is "0" and the search line /SL is "1") and the TCAM data is "1" (the storage node ND1 is "0" and the storage node ND2 is "1"), the MOS transistors Q8 and Q9 are turned on. As a result, the potential of the precharged match line ML is pulled down to the ground potential. In other words, when the search data and the TCAM data do not match, the potential of the match line ML is pulled down to the ground potential.

On the other hand, when the input search data is "1" and the TCAM data is "1" or "*", or when the search data is "0" and the TCAM data is "0" or "*" (namely, when the two match), the potential (power voltage VDD level) of the precharged match line ML is maintained.

As described above, in the TCAM, the charge accumulated in the match line ML is pulled down unless the data of all the TCAM cells coupled to the match line ML corresponding to one entry (row) match the input search data. Thus, search in the TCAM is fast but there is a problem that current consumption is large.

Figure 4:
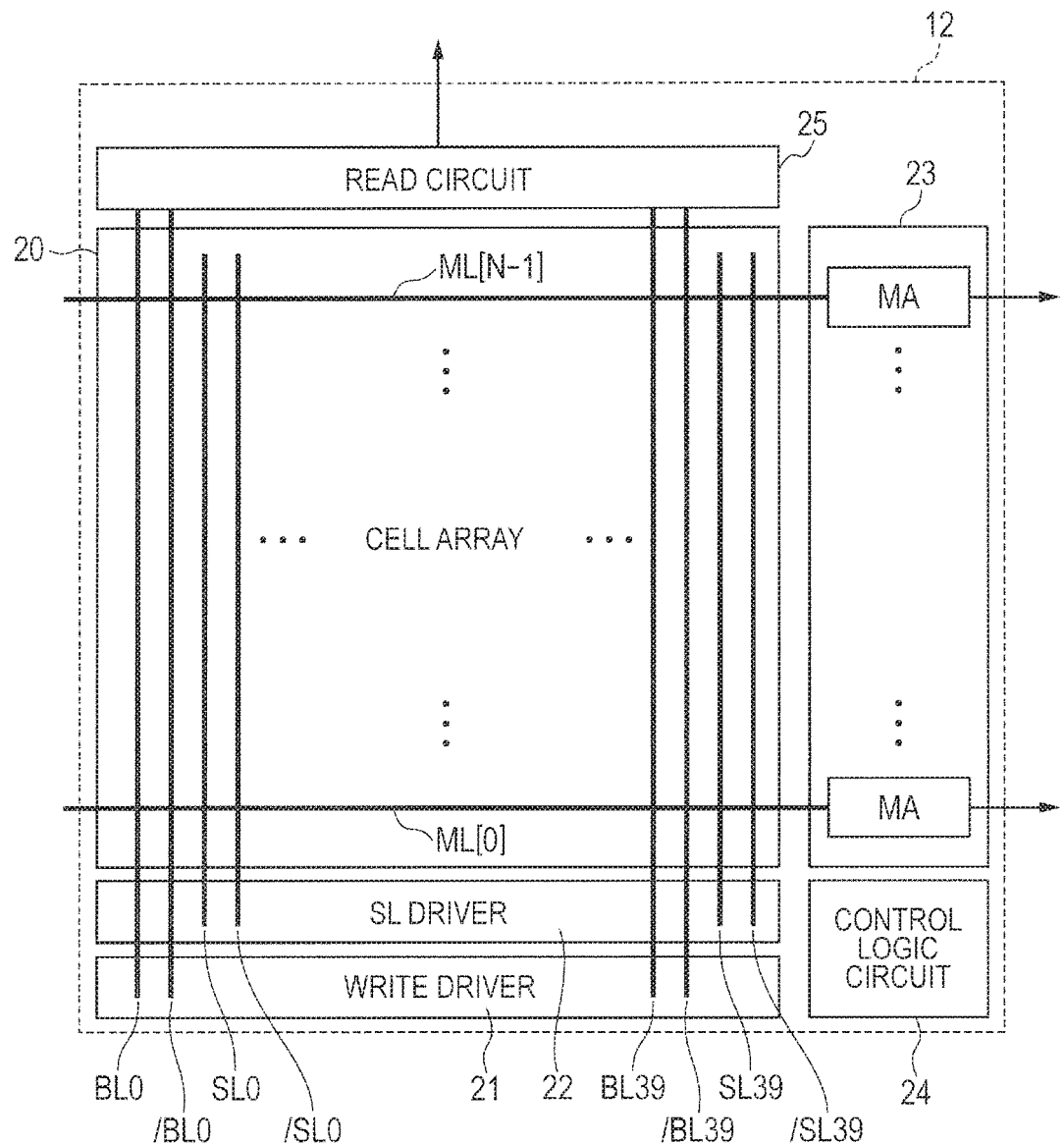
FIG. 4 is a diagram showing the configuration of a segment (sub block) 12 included in a search memory 8 based on the first embodiment.

FIG. 4 is a diagram showing the configuration of the segment (sub block) 12 included in the search memory 8 based on the first embodiment.

As shown in FIG. 4, the segment 12 includes the TCAM cell array 20 (also simply referred to as the cell array), a write driver 21, a search line driver 22, a match amplifier unit 23, a control logic circuit 24, and a read circuit 25.

Although not shown, the segment 12 includes a word line driver (not shown) for driving the word lines WLX and WLY, and an input/output circuit (not shown) for receiving the input of signals such as control signal and address signal.

The TCAM cell array 20 includes TCAM cells arranged in a matrix (m rows; k columns). This example shows a case in which the cell array 20 in which the number of rows (the number of entries) m is N and the number of columns (the number of bits) k is 40. Note that the cell array 20 has a redundant memory cell column for storing information relating to the retention characteristics of the potential of at least one or more match lines.

There are k (k=40) bit line pairs (BL0, /BL0 to BL(k−1), /BL(k−1)) corresponding to each of the columns of the cell array 20.

There are m (m=N) match lines (ML0 to ML(N−1)), m word lines for X cells (WLX0 to WLX(N−1)) not shown, and m word lines for Y cells (WLY0 to WLY(N−1)) not shown, which are provided corresponding to each of the rows of the cell array 20.

The write driver 21 provides write data to each TCAM cell through the bit line pair (BL, /BL) in writing. The search line driver 22 provides search data to each TCAM cell through the search line pair (SL, /SL) in searching.

The control logic circuit 24 controls the operation of the entire segment 12. For example, in searching, the control logic circuit 24 receives a search command and outputs a control signal to the search line driver 22 and the match amplifier unit 23, to control the operation of the search line driver 22, the match amplifier unit 23, and the precharge circuit. In reading, the control logic circuit 24 receives a read command and outputs a control signal for controlling the read circuit 25. In this way, it is possible to read and output entry data stored in the cell array 20.

The match amplifier unit 23 includes a plurality of match amplifiers MA corresponding to each of the rows of the cell array. In searching, the match amplifier MA detects whether the corresponding TCAM cell data and the corresponding part of the input search data match or not based on the potential of the corresponding match line ML. In this embodiment, the match amplifier MA includes a precharge circuit for precharging the corresponding match line ML in searching.

Figure 5:
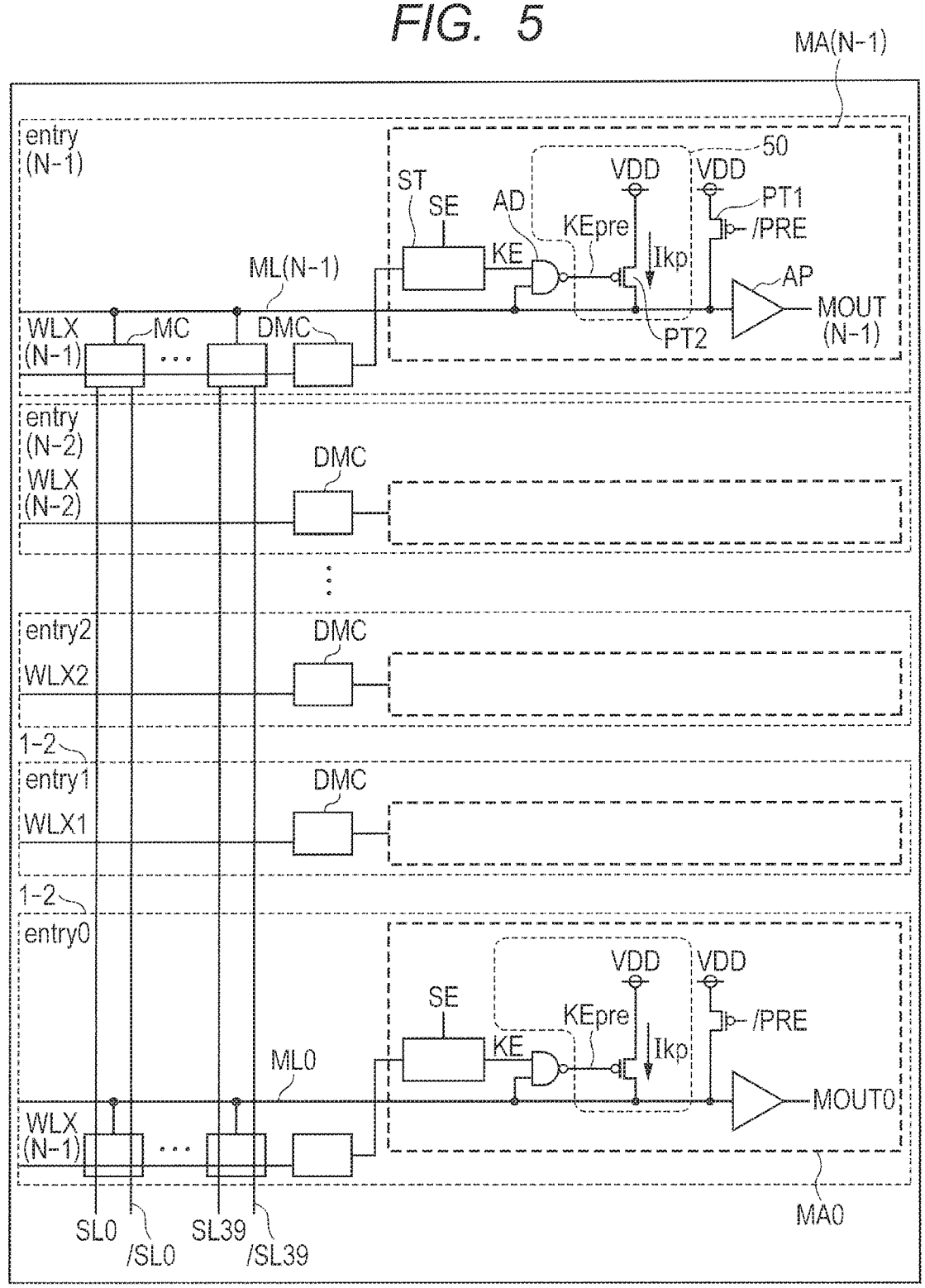
FIG. 5 is a diagram showing the configuration of a match amplifier unit based on the first embodiment.

FIG. 5 is a diagram showing the configuration of the match amplifier unit based on the first embodiment.

As shown in FIG. 5, the match amplifier is provided for each entry.

This example shows a case in which a plurality of match amplifiers (MA0 to MA(N−1)) are provided corresponding to each of a plurality of entries (entry0 to entry(N−1)).

All the match amplifiers (MA0 to MA(N−1)) have the same configuration.

Each entry includes 40 memory cells MC and dummy memory cells DMC. The dummy memory cell DMC stores the information relating to the state of the corresponding match line ML. For example, the dummy memory cell DMC stores the information relating to the retention characteristics of the potential ("H" level) of the corresponding match line ML. The dummy memory cell DMC does not perform a comparison with the search data and so is not coupled to the match line ML.

The match amplifier MA includes an amplifier AP for amplifying the data of the match line ML, a P-channel MOS transistor PT1 as a precharge circuit, a match line retention circuit 50 for maintaining the potential of the match line ML, an AND circuit AD, and a set circuit ST.

The AND circuit AD and the set circuit ST function as a selection circuit for selecting the match line retention circuit 50.

The P-channel MOS transistor PT1 receives the input of a control signal /PRE. The P-channel MOS transistor PT1 is turned on in response to the control signal /PRE ("L" level). In accordance with this, the power supply voltage VDD and the match line ML are electrically coupled to each other and the match line ML is precharged to the voltage level of the power supply voltage VDD. In this way, the preparation of the search operation is executed.

The match line retention circuit 50 includes a P-channel MOS transistor PT2.

In the P-channel MOS transistor PT2, the source side is coupled to the power supply voltage VDD and the drain side is coupled to the match line ML. The gate of the P-channel MOS transistor PT2 receives the input of a control signal KEpre.

The set circuit ST is activated in response to the control signal SE, and outputs a control signal KE based on the information stored in the corresponding dummy memory cell DMC.

The AND circuit AD outputs the result of the logical AND operation with the signal based on the potential of the match line ML, as the control signal KEpre.

For example, when the data "1" is stored in the dummy memory cell DMC, the set circuit ST outputs a control signal KE ("H" level) in response to the control signal ST ("H" level).

When the potential of the match line ML is "H" level, the AND circuit AD outputs a control signal KEpre ("L" level) based on the control signal KE ("H" level) and the potential ("H" level) of the match line ML. In accordance with this, the P-channel MOS transistor PT2 is turned on, and then the power supply voltage VDD and the match line ML are electrically coupled to each other. As a result, the match line ML is charged and the potential of the match line ML is maintained at "H" level. Thus, the retention characteristics of the potential ("H" level) of the match line ML can be improved.

On the other hand, when the potential of the match line ML is "L" level, the AND circuit AD outputs a control signal KEpre ("H" level). In this case, the P-channel MOS transistor PT2 is turned off. However, at the time when the potential of the match line ML changes from "H" level to "L" level, shoot-through current Ikp occurs in the match line retention circuit 50.

Next, when the data "0" is stored in the dummy memory cell DMC, the set circuit ST outputs a control signal KE ("L" level) in response to the control signal SE.

In this case, the AND circuit AD outputs a control signal KEpre ("L" level) regardless of the potential of the match line ML.

Thus, by storing the data "0" in the dummy memory cell DMC of the entry not requiring relief of the retention characteristics of the potential of the match line, it is possible to prevent the occurrence of shoot-through current when the entry not requiring relief of the retention characteristics of the potential of the match line shows mismatch.

Figure 6:
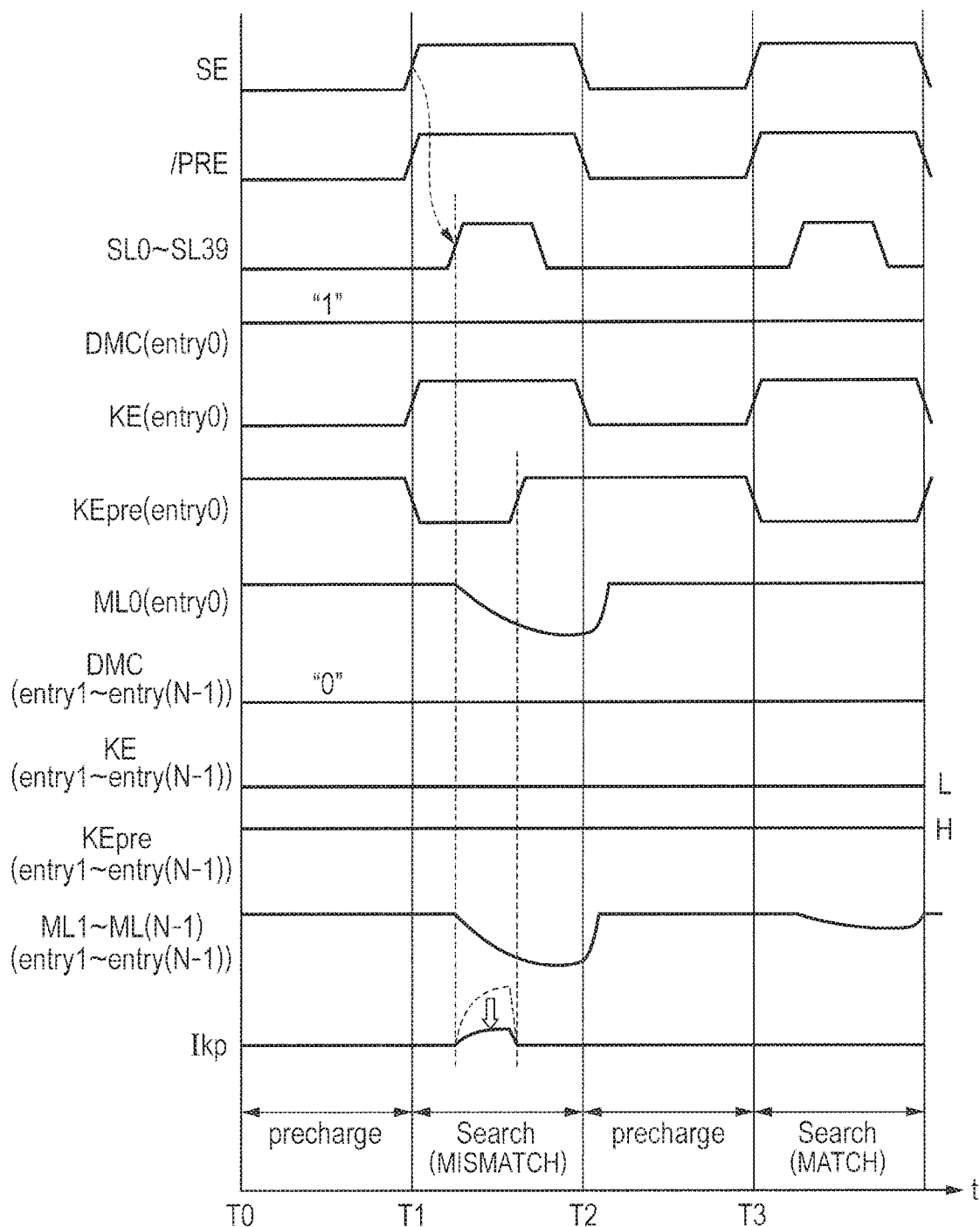
FIG. 6 is a diagram showing a timing chart of search operation based on the first embodiment.

FIG. 6 is a diagram showing a timing chart of the search operation based on the first embodiment.

Referring to FIG. 6, this shows a case in which all the entries mismatch and a case in which all the entries match in the search operation of the segment 12.

In this example, it is assumed that the data of "1" is stored in the dummy memory cell DMC of an entry (entry0). Further, it is assumed that the data of "0" is stored in the dummy memory cells DMC of the entries (entry1 to entry(N−1)).

The period between time T0 and T1 is set to a precharge period. In this case, the control signal /PRE is set to "L" level.

Thus, the match lines ML0 to ML(N−1) of all the entries are precharged to the voltage level of the power supply voltage VDD by the precharge circuit.

Next, at time T1, the control signal SE that performs a search operation is activated (at "H" level).

In accordance with this, the search line driver 22 drives the search lines SL and/SL according to the search data.

The potential of the match line ML changes depending on the search result (comparison result between the corresponding part of the input search data and the TCAM cell data). In other words, when the two match (hit), the potential of the match line ML maintains at the power supply voltage VDD ("H" level), while when the two do not match (miss), the charge of the match line ML is discharged to a ground node, so that the potential of the match line changes to the ground voltage ("L" level).

This example shows a case of mismatch in all the entries and all the match lines ML0 to ML(N−1) are set to the ground potential ("L" level).

The match amplifier MA 0 in this case will be described.

Because the data of "1" is stored in the dummy memory cell DMC of the entry(entry0), the control signal KE ("H" level) is output in response to the control signal SE ("H" level). The AND circuit AD outputs a control signal KEpre ("L" level) based on the control signal KE as well as the potential ("H" level) of the match line ML0. Thus, the P-channel MOS transistor PT2 is turned on.

Because of this, in the entry(entry0), shoot-through current Ikp flows through the P-channel MOS transistor PT2 in the initial stage of the search period. In the latter half of the search period, the AND circuit AD outputs a control signal KEpre ("H" level) according to the potential ("L" level) of the match line ML 0. In accordance with this, the P-channel MOS transistor PT2 is turned off and so the shoot-through current Ikp does not flow.

Next, the match amplifiers MA1 to MA(N−1) will be described.

The data of "0" is stored in the dummy memory cells DMC of the entries (entry1 to entry(N−1)). Thus, the control signal KE ("L" level) is output in response to the control signal SE ("H" level). The AND circuit AD outputs the control signal KEPre ("H" level) based on the control signal KE as well as the potential ("H" level) of the match line ML. Thus, the P-channel MOS transistor PT2 is not turned on.

Because of this, in the entries (entry1 to entry(N−1)), P-channel MOS transistor PT2 is turned off and so shoot-through current Ikp does not flow in the search period.

Next, at time T2, the control signal/PRE is set to "L" level.

Thus, all the entries of the match lines ML0 to ML(N−1) are precharged to the voltage level of the power supply voltage VDD by the precharge circuit.

Next, at time T3, the control signal SE is activated (at "H" level) to perform the search operation.

In accordance with this, the search line driver 22 drives the search lines SL and/SL according to the search data.

The potential of the match line ML changes depending on the search result (the comparison result between the corresponding part of the input search data and the TCAM cell data).

This example shows the case of match in all the entries, in which all the match lines ML0 to ML (N−1) are set to the potential ("H" level) of the power supply voltage VDD.

The match amplifier MA0 in this case will be described.

The data of "1" is stored in the dummy memory cell DMC of the entry(entry0) and a control signal KE ("H" level) is output in response to the control signal SE ("H" level). The AND circuit AD outputs a control signal KEPre ("L" level) based on the control signal KE as well as the potential ("H" level) of the match line ML0. Thus, the P-channel MOS transistor PT2 is turned on.

Thus, in the entry(entry0), the match line ML0 maintains the potential of the power supply voltage VDD through the P-channel MOS transistor PT2 in the search period.

Next, the match amplifiers MA1 to MA(N−1) will be described.

The data of "0" is stored in the dummy memory cells DMC of the entries (entry1 to entry(N−1)). Thus, a control signal KE ("L" level) is output in response to the control signal SE ("H" level). The AND circuit AD outputs a control signal KEpre ("H" level) based on the control signal KE and the potential ("H" level) of the match line ML(N−1). Thus, the p-channel MOS transistor PT2 is not turned on.

In accordance with this, in the entries (entry1 to entry(N−1)), the P-channel MOS transistor PT2 is turned off in the search period. It is shown that as the match line retention circuit 50 does not function, each match line ML is maintained at a potential slightly lower than the power supply voltage VDD.

The conventional approach does not have a configuration to selectively activate the match line retention circuit 50 in the search operation, so that shoot-through current occurs in all mismatched entries and power consumption is likely to increase.

With the configuration based on the first embodiment, it is possible to selectively activate the match line retention circuit 50 and to achieve lower power consumption by reducing unnecessary shoot-through current.

Further, by testing the retention characteristics of the potential of the match line in advance and by storing the information to determine whether or not to activate the match line retention circuit 50 according to the test results into the dummy memory cell DMC, it is possible to improve the retention characteristics of the potential of the match line and to improve the yield by selectively activating the match line retention circuit 50 of the match line ML with poor retention characteristics of the potential of the match line.

Further, in this example, information (information to determine whether or not to activate the match line retention circuit 50) relating to the state of the match line is stored in the dummy memory cell DMC, so that there is no need to separately provide a device to store the information and thus it is possible to achieve with a simple configuration.

Note that the information is not necessarily stored in the dummy memory cell DMC and can also be stored in other memories (for example, ROM (Read Only Memory) and the like) or fuses or resisters. In this case, the set circuit ST sets the control signal KE by obtaining information from other memories (for example, ROM (Read Only Memory) and the like) or fuses or registers, and the like, in response to the control signal SE.

Second Embodiment

Figure 7:
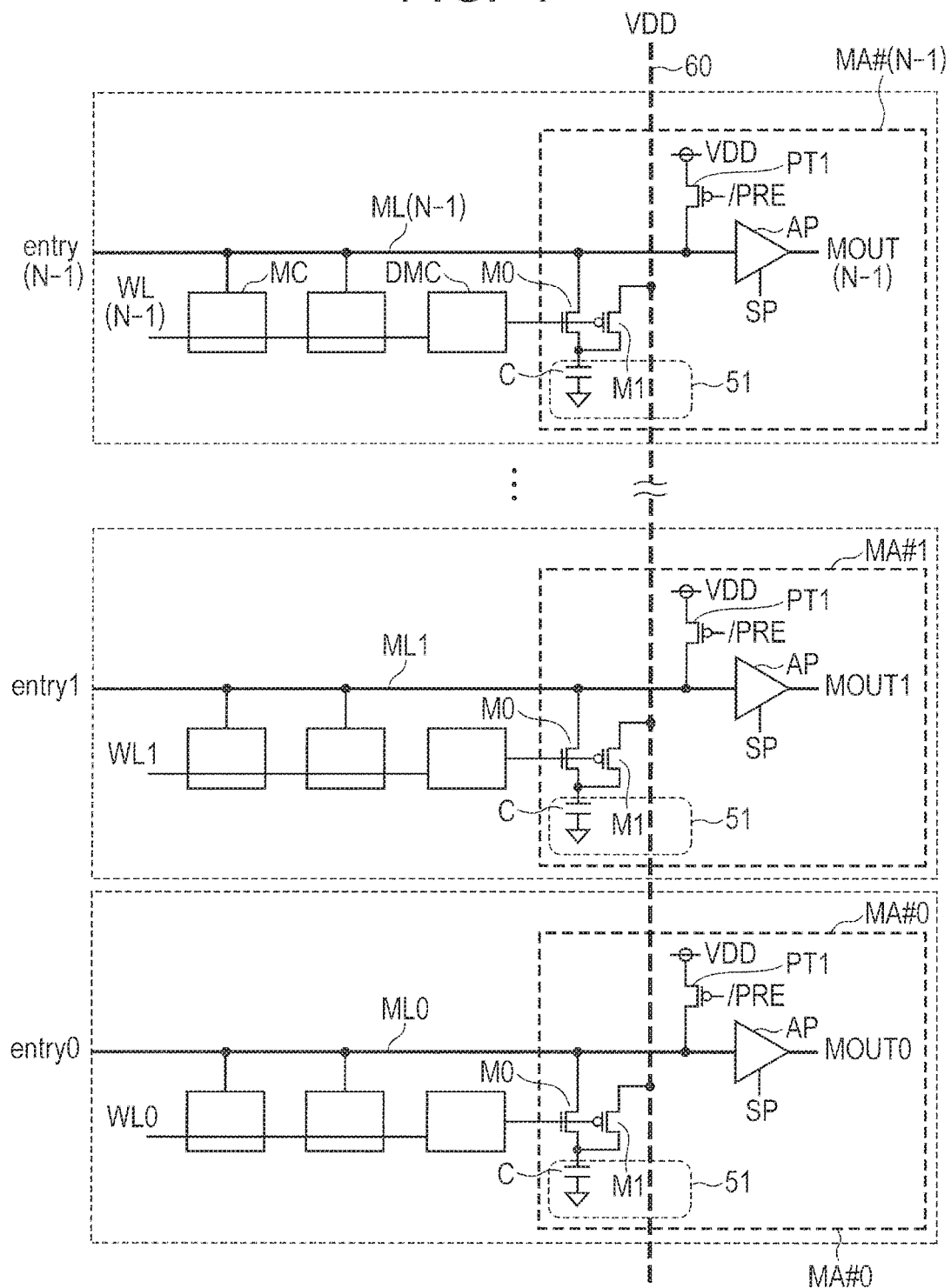
FIG. 7 is a diagram showing the configuration of a match amplifier unit based on a second embodiment.

FIG. 7 is a diagram showing the configuration of a match amplifier unit based on a second embodiment.

As shown in FIG. 7, a match amplifier is provided for each entry.

This example shows a case in which a plurality of match amplifiers (MA #0 to MA #(N−1)) are provided corresponding to each of a plurality of entries (entry0 to entry(N−1)).

All the match amplifiers (MA #0 to MA #(N−1)) have the same configuration. Note that the match amplifiers (MA #0 to MA #(N−1)) are also collectively referred to as the match amplifier MA #.

Similarly to the first embodiment, each entry includes 40 memory cells MC and dummy memory cells DMC. The dummy memory cell DMC stores the information relating to the retention characteristics of the potential of the corresponding match line ML.

The match amplifier MA # includes an amplifier AP for amplifying the data of the match line ML, a P-channel MOS transistor PT1 as a precharge circuit, a match line retention circuit 51 for maintaining the potential of the match line ML, an N-channel MOS transistor M0, and a P-channel MOS transistor M1.

The amplifier AP amplifies the data of the match line ML in response to the control signal SP.

The N-channel MOS transistor M0 and the P-channel MOS transistor M1 function as a selection circuit for selecting the match line retention circuit 51.

The P-channel MOS transistor PT1 receives the input of a control signal/PRE. The P-channel MOS transistor PT1 is turned on in response to the control signal/PRE ("L" level). In accordance with this, the power supply voltage VDD and the match line ML are electrically coupled to each other and the match line ML is precharged to the voltage level of the power supply voltage VDD. In this way, the preparation of the search operation is executed.

The match line retention circuit 50 includes a capacitance element C.

The capacitance element C is coupled to the match line ML through the N-channel MOS transistor M0. Further, the capacitance element C is coupled to a power supply line 60 that supplies the power supply voltage VDD through the P-channel MOS transistor M1 coupled in parallel to the N-channel MOS transistor M0.

The gates of the N-channel MOS transistor M0 and the P-channel MOS transistor M1 are coupled to the storage node of the dummy memory cell DMC. Thus, the N-channel MOS transistor M0 and the P-channel MOS transistor M1 have a switch function based on the data stored in the dummy memory cell DMC, and are operated complementarily to each other.

For example, when the data "1" is stored in the dummy memory cell DMC, the N-channel MOS transistor M0 is turned on. Thus, the capacitance element C is coupled to the match line ML. On the other hand, when the data "0" is stored in the dummy memory cell DMC, the P-channel MOS transistor M1 is turned on. Thus, the capacitance element C is coupled to the power supply line 60.

Figure 8:
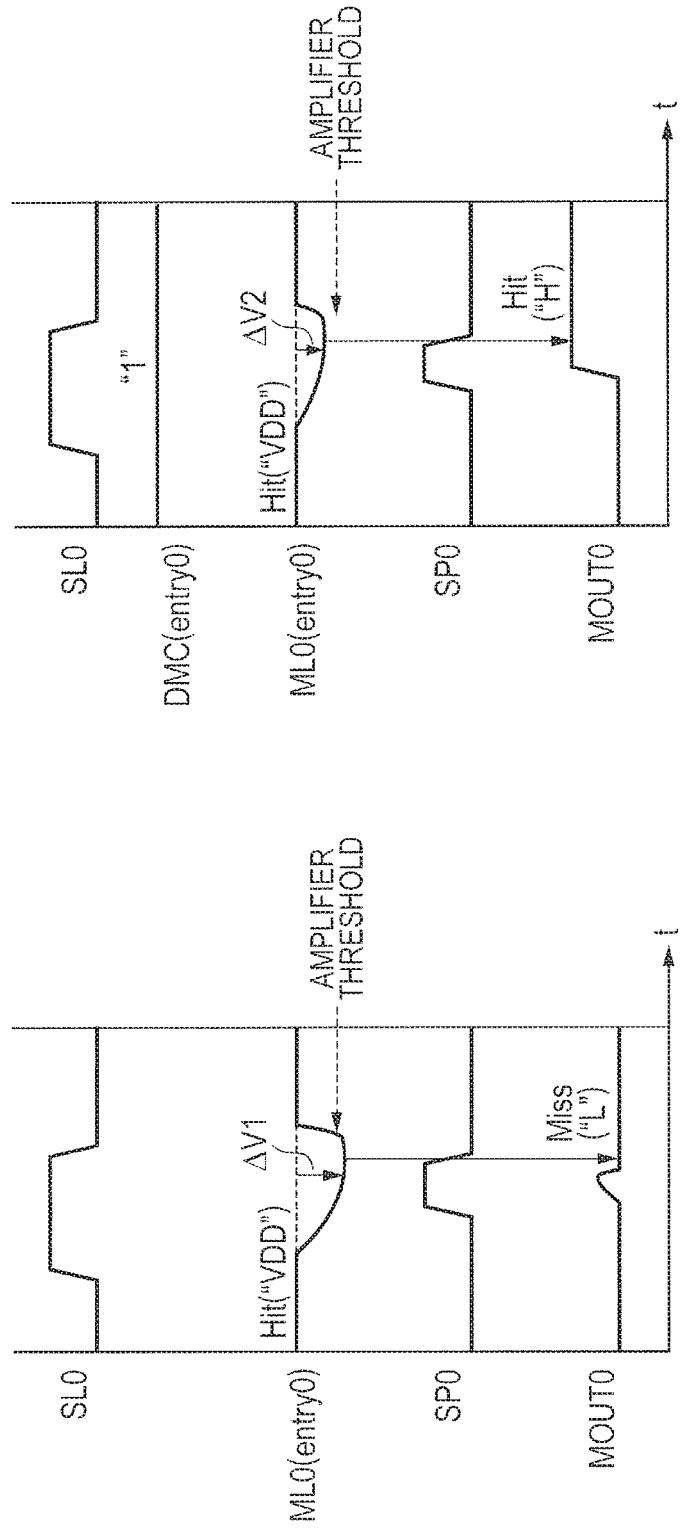
FIGS. 8A and 8B are diagrams showing the search operation based on the second embodiment.

FIGS. 8A and 8B show an example of a search operation based on the second embodiment.

Referring to FIG. 8A, an example of a conventional search operation is shown as a comparative example.

Here, a case is described in which the retention characteristics of the potential of the match line ML0 of the entry (entry0) are poor. It is shown that because the retention characteristics of the potential of the match line ML0 are poor, the potential of the match line ML0 is reduced even in the case of match.

Then, at the timing when a control signal SP is input to the amplifier AP, the potential of the match line ML0 is reduced. Thus, the amplifier AP outputs it as an output signal MOUT0 ("L" level) according to the potential of the match line ML0. In other words, when the retention characteristics of the potential of the match line ML0 are poor, the entry may be determined to be mismatched even if it is matched.

The operation of the match amplifier MA # based on the second embodiment will be described with reference to FIG. 8B.

Here, a case is described in which the data "1" is stored in the dummy memory cell DMC when the retention characteristics of the potential of the match line ML0 of the entry(entry0) are poor.

In this case, the N-channel MOS transistor M0 is turned on, so that the capacitance element C is coupled to the match line ML0.

Because the capacitance element C is coupled to the match line ML0, the voltage change of the match line ML0 is moderate.

The voltage change of the match line M0 can be further reduced to ΔV1 from ΔV2.

Thus, at the timing when the control signal SP is input to the amplifier AP, the reduction of the potential of the match line ML0 is reduced. Thus, the amplifier AP outputs it as an output signal MOUT0 ("H" level) according to the potential of the match line ML0. In other words, even if the retention characteristics of the potential of the match line ML0 are poor, it is possible to appropriately determine in the case of match.

By using the capacitance element as the match line retention circuit, it is possible to eliminate the need for a circuit to control the match line retention circuit and to achieve with a simple configuration.

Further, when the retention characteristics of the potential of the match line are good and there is no need to function the match line retention circuit to relieve the retention characteristics of the potential of the match line, the capacitance element can be used as decoupling capacitance by coupling the capacitance element to the power supply line 60. Thus, it is also possible to reduce the power supply noise.

Third Embodiment

In recent years, the demand for high capacity search systems has been increasing and the layout area of the search memory 8 has also been increasing.

Figure 9:
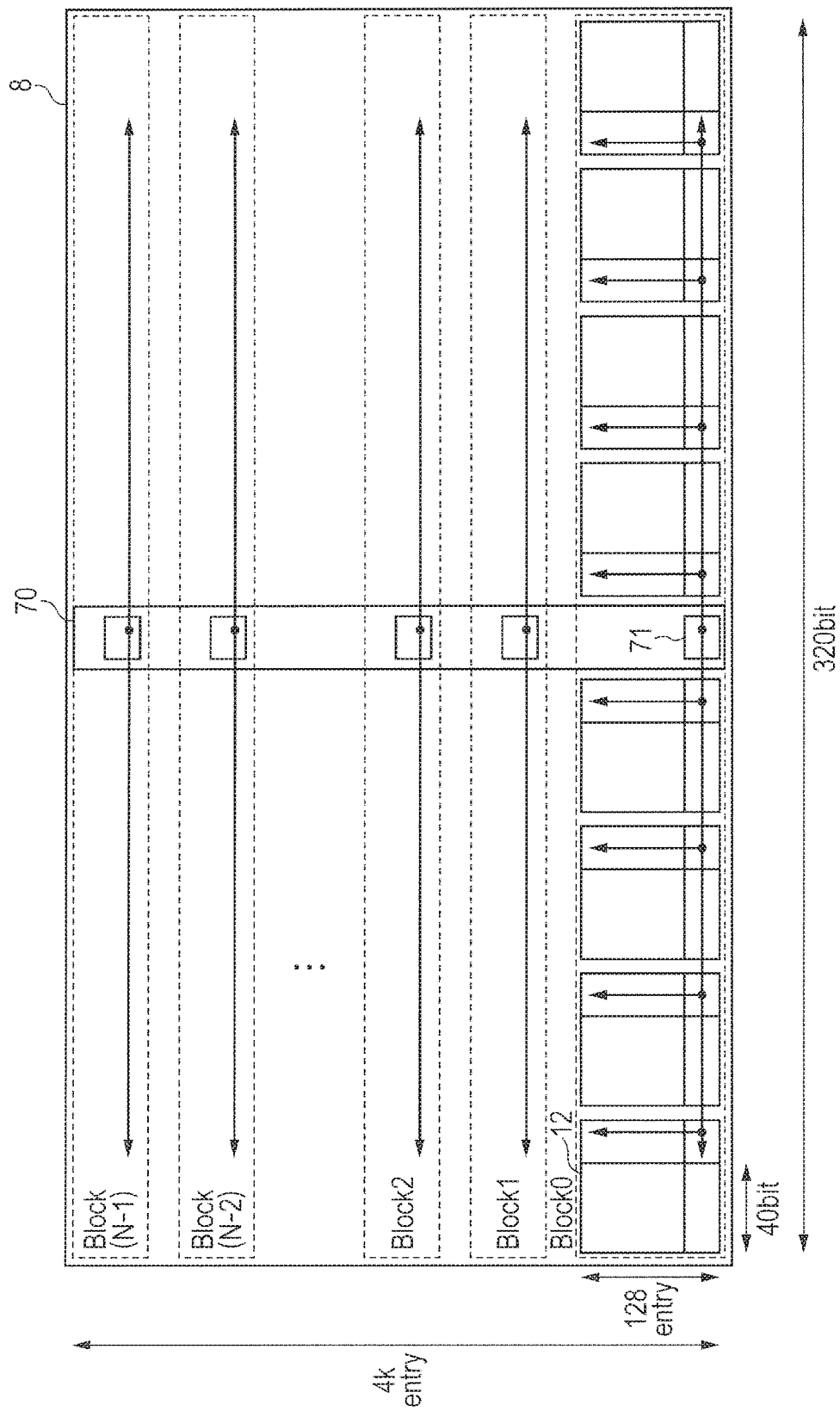
FIG. 9 is a diagram showing a plurality of segments included in the search memory 8 based on a third embodiment.

FIG. 9 is a diagram showing a plurality of segments included in the search memory 8 based on a third embodiment.

As shown in FIG. 9, this example shows an array configuration of 320 bits×4 k entries.

There are provided N blocks.

Each of the blocks (0 to N−1) is provided with 8 segments 12, each having 40 bits×128 entries.

In the third embodiment, information for selectively activating the match line retention circuit 50 is stored in a register 70. The register 70 includes a plurality of storage units 71. The storage unit 71 stores information to determine whether or not to activate the match line retention circuit 50 for each block.

In other words, when the information is stored in the storage unit 71 with respect to a block (Block0), all the match line retention circuits 50 of 8 segments 12 belonging to the block are activated.

Further, in the conventional approach, the match line retention circuits in the match amplifiers MA of all the entries of all the blocks (Block0 to Block(N−1)) are operated. Thus, as described above, unnecessary shoot-through circuit flows with respect to the entry in which the retention characteristics of the potential of the match line are not poor in the case of mismatch.

In this configuration, for example, when there is an entry in which a match line defect occurs only in a block (Block0), the information for activating the match line retention circuit 50 of the block is stored in the storage unit 71. In this way, a current reduction effect of about 1/N can be expected, in which N is the number of blocks of the entire array configuration.

Further, by providing the storage unit 71 for each block to share information to be stored, it is possible to reduce the layout area and thus to prevent the chip area from increasing.

Note that while the foregoing has described the method for storing the information in the storage unit 71, the present invention is not limited to this example. It is also possible to store the information in the dummy memory cell DMC, or it is possible to write the information into other memories (for example ROM (Read Only Memory)) or fuses or registers.

Fourth Embodiment

In a fourth embodiment, a method is described for achieving lower power consumption than in the method according to the first embodiment.

Figure 10:
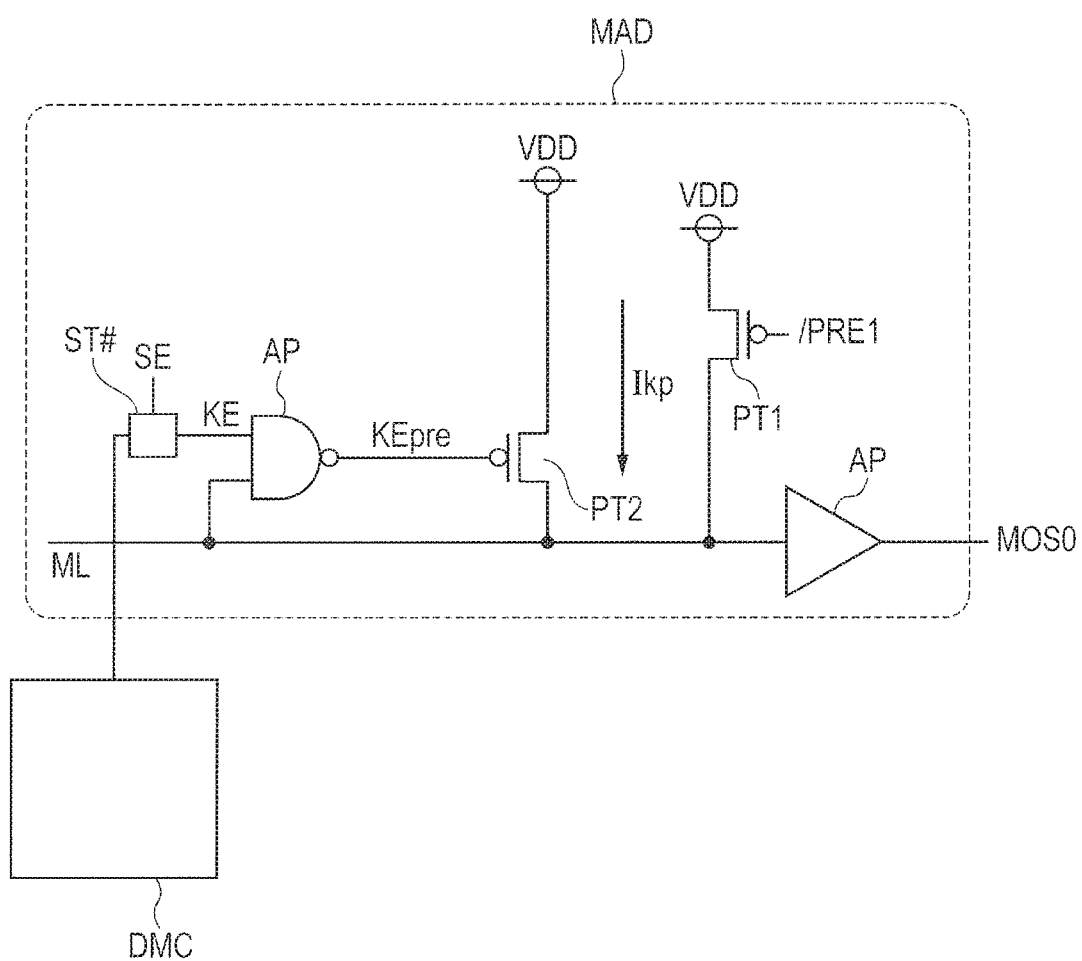
FIG. 10 is a diagram showing the configuration of a match amplifier based on a fourth embodiment.

FIG. 10 is a diagram showing the configuration of a match amplifier based on the fourth embodiment.

As shown in FIG. 10, a match amplifier MAD based on the fourth embodiment is provided.

Compared to the match amplifier MA, the match amplifier MAD is different in that the set circuit ST is replaced with a set circuit ST #. Other configurations are the same and the detailed description is not repeated.

The set circuit ST # adjusts the timing of outputting the control signal KE. More specifically, the set circuit ST # outputs the control signal KE by delaying the timing of the control signal KE that the set circuit ST # outputs. As an example, it may be possible to delay the timing by a buffer or a delay circuit configured with resistance and capacitor.

FIGS. 11A and 11B are diagrams showing a search operation based on the fourth embodiment.

Referring to FIG. 11A, an example of the search operation of the first embodiment is shown as a comparative example.

In this example, an entry(entry0) will be described.

It is assumed that the data of "1" is stored in the dummy memory cell DMC.

Further, a case of mismatch in the entry(entry0) is described.

As described above, in the entry (entry0), the shoot-through current Ikp flows through the P-channel MOS transistor PT2 in the initial stage of the search period. When the potential of the match line ML0 becomes low in the latter half of the search period, the AND circuit AD outputs a control signal KEpre ("H" level) according to the potential ("L" level) of the match line ML0. In accordance with this, the P-channel MOS transistor PT2 is turned off, so that the shoot-through current Ikp will not flow from this point.

Referring to FIG. 11B, this shows an example of the search operation of the fourth embodiment.

In this example, the set circuit ST # delays the timing of outputting the control signal KE. More specifically, the set circuit ST # outputs a control signal KE ("H" level) at time T4.

The AND circuit AD outputs the result of the logical AND operation between the control signal KE and the potential of the match line ML, as control signal KEpre.

In this case, because the potential of the match line ML was reduced at time T4, the control signal KEpre ("H" level) output from the AND circuit AD remains unchanged.

Thus, the P-channel MOS transistor PT2 is not turned on and so the shoot-through current Ikp does not flow.

In this way, even if the entry whose match line retention circuit should be activated shows mismatch, it is possible to achieve low power consumption by further reducing the shoot-trough current Ikp.

Further, it is possible to significantly reduce the power consumption by reducing unnecessary shoot-through current by applying this method to the large capacity search memory 8 of FIG. 9, which has been described in the third embodiment. In addition, the delay of the set circuit ST # is controlled by the storage unit 71 provided for each block, which has been described in the third embodiment. In this way, it is possible to eliminate the use of the dummy memory cell DMC provided for each entry and thus to reduce the area.

Fifth Embodiment

Figure 12:
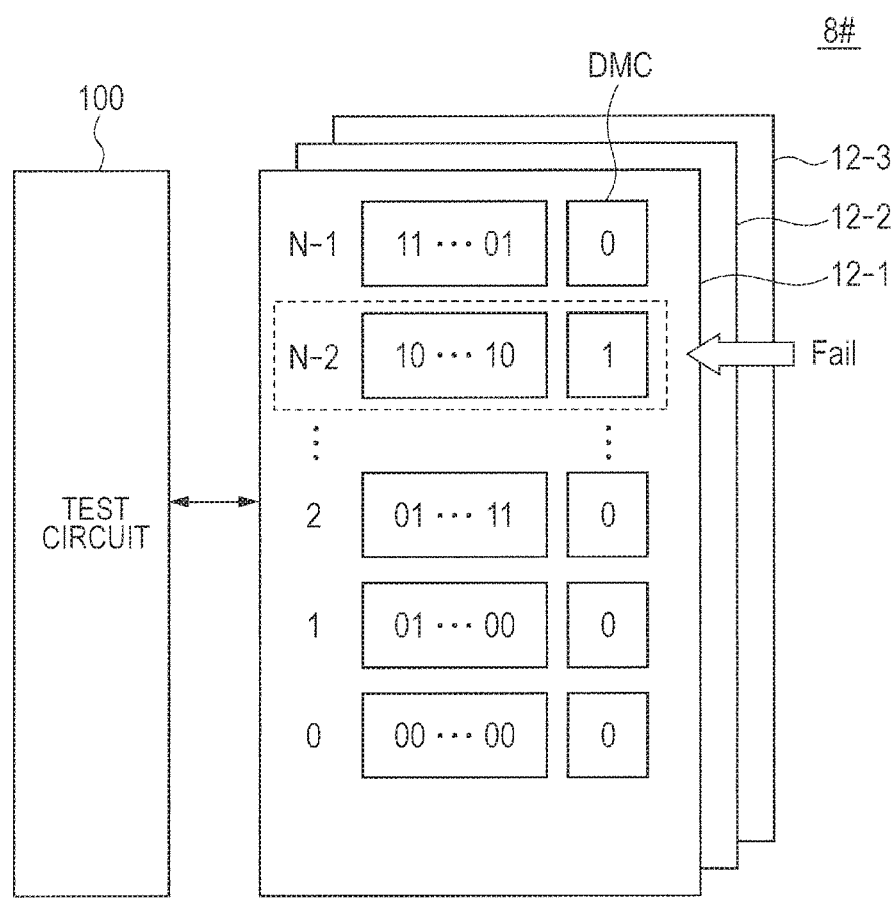
FIG. 12 is a diagram showing the configuration of a search memory 8 # based on a fifth embodiment.

FIG. 12 is a diagram showing the configuration of a search memory 8 # based on a fifth embodiment.

Referring to FIG. 12, the search memory 8 # includes a plurality of segments 12-1 to 12-3 as well as a test circuit 100. The test circuit 100 performs a test operation on each segment 12.

More specifically, the test circuit 100 determines and relieves poor retention characteristics of the potential of the match line ML corresponding to all the entries included in each segment 12.

Figure 13:
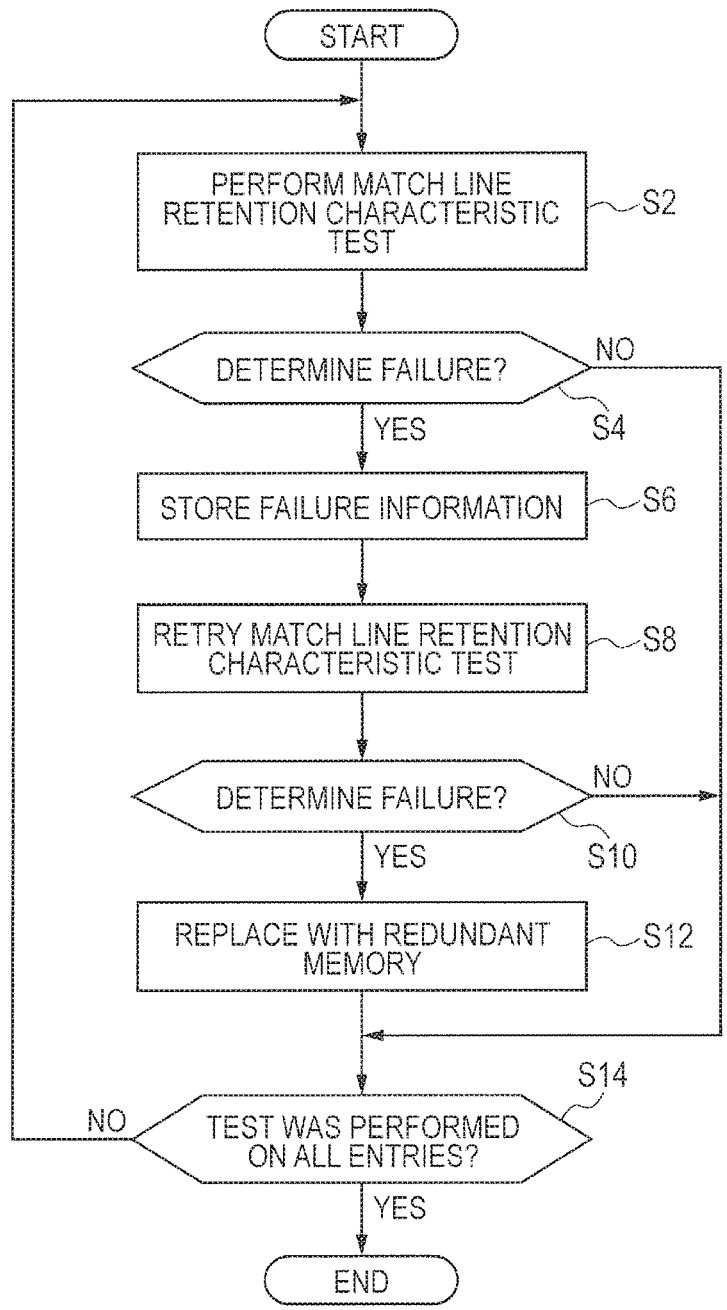
FIG. 13 is a flowchart showing the test operation in a test circuit 100 based on the fifth embodiment.

FIG. 13 is a flow chart showing the test operation in the test circuit 100 based on the fifth embodiment.

Referring to FIG. 13, the test circuit 100 performs a retention characteristic test of the potential of the match line (Step S2).

For example, the test circuit 100 writes predetermined data for each entry of the segment 12. In this example, as shown in FIG. 12, the test circuit 100 writes different data in each of the entries. The test circuit 100 performs a search operation with the data written in each entry as search data.

When the match amplifier MA corresponding to the entry of the written data outputs match ("H" level), the test circuit 100 determines that the match line ML corresponding to the entry is good. On the other hand, when the match amplifier MA outputs mismatch ("L" level), the test circuit 100 determines that the match line ML corresponding to the entry is failed.

The test circuit 100 determines whether or not the match line ML is failed by the search operation (Step S4).

In Step S4, when it is determined that the match line ML is not failed (NO in Step S4), the test circuit 100 proceeds to Step S14.

On the other hand, in Step 4, when it is determined that the match line ML is failed (YES in Step S4), the test circuit 100 stores the failure information (Step S6). More specifically, the test circuit 100 stores the data of "1" in the dummy memory cell DMC included in the corresponding entry.

Next, the test circuit 100 retries the retention characteristic test of the potential of the match line (Step S8).

More specifically, when the match amplifier MA corresponding to the entry of the written data outputs match ("H" level), the test circuit 100 determines that the match line ML corresponding to the entry is good. On the other hand, when the match amplifier MA outputs mismatch ("L" level), the test circuit 100 determines that the match line ML corresponding to the entry is failed. Note that, in this case, the data "1" is stored in the dummy memory cell DMC as described in the first embodiment, so that the match line retention circuit 50 functions and operates.

Next, the test circuit 100 determines whether or not the match line ML is failed (Step S10).

In Step 10, when it is determined that the match line ML is not failed (NO in Step S10), the test circuit 100 proceeds to Step S14.

On the other hand, in Step S10, when it is determined that the match line ML is failed (YES in Step S10), the test circuit 100 replaces the match line ML with a redundant memory (Step S12). More specifically, because the entry is failed and unable to be relieved even by using the match line retention circuit 50, the test circuit 100 relieves it by using the redundant memory.

Next, the test circuit 100 determines whether not the test is completed for all the entries (Step S14).

In Step S14, when it is determined that the test is completed for all the entries, the test circuit 100 ends the process (end).

In Step S14, when it is determined that the test is not completed for all the entries, the test circuit 100 returns to Step S2, and repeats the above process until the test is completed for all the entries.

By this process, the test circuit 100 tests the retention characteristics of the potential of the match lines ML included in the segment 12, while determining whether relief is available by using the match line retention circuit 50. When relieve is not available, the test circuit 100 provides relief by using the redundant memory. In this way, it is possible to reduce the extraction rate due to poor retention characteristics of the potential of the match line ML.

Further, when relief is available by using the match line retention circuit 50 based on this method, the redundant memory is not used. In this case, it is also possible to reduce the capacity of the redundant memory and to achieve a reduction in size.

Sixth Embodiment

The above embodiment has described, as an example, the case of performing the retention characteristic test of the potential of the match line by using the test circuit 100 in the shipping stage. However, it is also possible to perform the same test after shipping.

In general, a semiconductor device with a search memory has a parity check function which is a function for checking whether the data stored in the memory cell is rewritten due to defects such as soft error and aging degradation.

The retention characteristic test of the potential of the match line can also be performed by using the parity check function.

Figure 14:
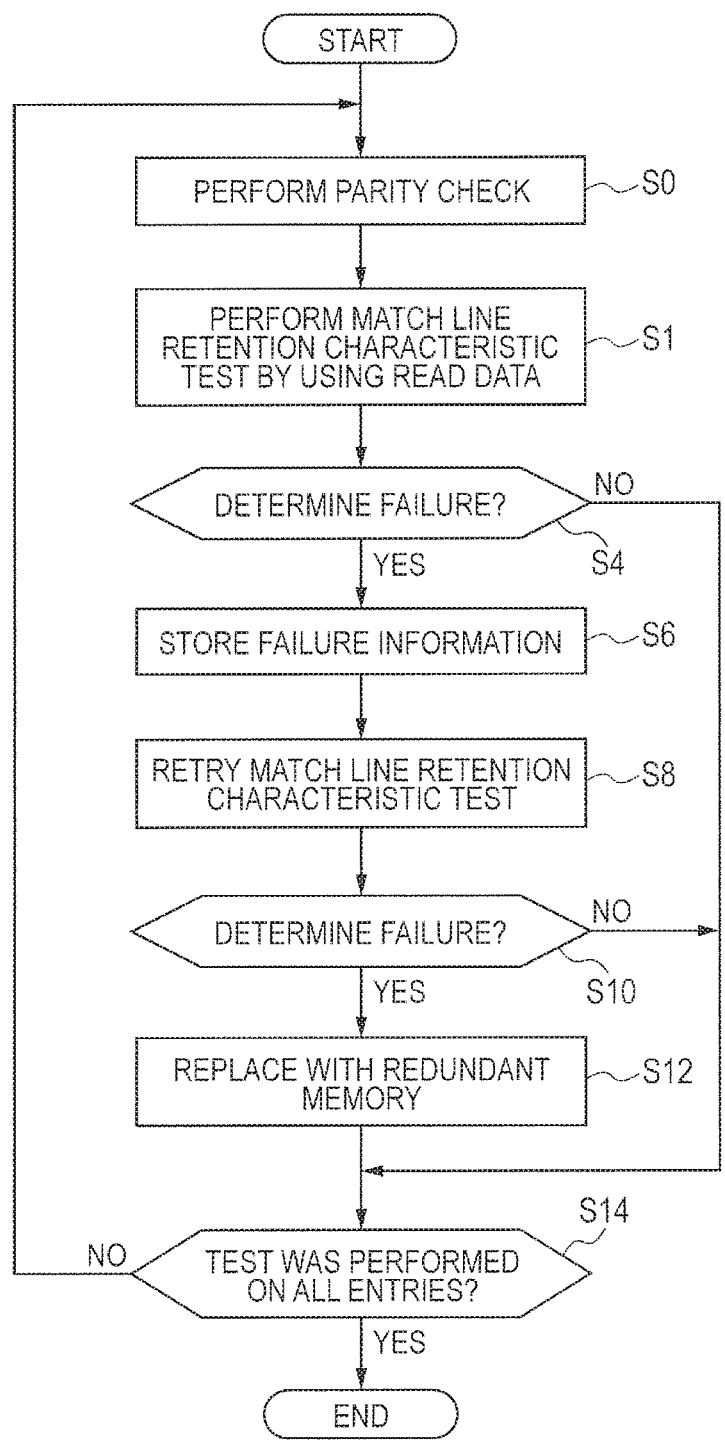
FIG. 14 is a flow chart showing the test operation in the test circuit 100 based on a sixth embodiment.

FIG. 14 is a flow chart showing the test operation in the test circuit 100 based on a sixth embodiment.

Referring to FIG. 14, the test circuit 100 performs a parity check (Step S0).

For example, the test circuit 100 reads the data stored in each of the entries of the segment 12, and performs a parity check based on parity data.

Next, the test circuit 100 performs a retention characteristic test of the potential of the match line based on the read data (Step S1).

More specifically, the test circuit 100 performs a search operation with the data read from each entry as search data.

When the match amplifier MA corresponding to the entry of the read data outputs match ("H" level), the test circuit 100 determines that the match line ML corresponding to the particular entry is good. On the other hand, when the match amplifier MA outputs mismatch ("L" level), the test circuit 100 determines that the match line ML corresponding to the particular entry is failed.

The test circuit 100 determines whether or not the match line ML is failed by the search operation (Step S4).

In Step S4, when it is determined that the match line ML is not failed (NO in Step S4), the test circuit 100 proceeds to Step S14.

On the other hand, in Step S4, when it is determined that the match line ML is failed (YES in Step S4), the test circuit 100 stores the failure information (Step S6). More specifically, the test circuit 100 stores the data of "1" in the dummy memory cell DMC included in the corresponding entry.

Next, the test circuit 100 performs a retention characteristic test of the potential of the match line (Step S8).

More specifically, when the match amplifier MA corresponding to the entry of the read data outputs match ("H" level), the test circuit 100 determines that the match line ML corresponding to the particular entry is good. On the other hand, when the match amplifier MA outputs mismatch ("L" level), the test circuit 100 determines that the match line ML corresponding to the particular entry is failed. Note that, in this case, the data of "1" is stored in the dummy memory cell DMC, so that the match line retention circuit 50 functions and operates as described in the first embodiment.

Next, the test circuit 100 determines whether or not the match line ML is failed (Step S10).

In Step S10, when it is determined that the match line ML is not failed (NO in Step S10), the test circuit 100 proceeds to Step S14.

On the other hand, in Step S10, when it is determined that the match line ML is failed (YES in Step S10), the test circuit 100 replaces the match line ML with a redundant memory (Step S12). More specifically, because the entry is failed and unable to be relieved even by using the match line retention circuit 50, the test circuit 100 relieves it by using the redundant memory.

Next, the test circuit 100 determines whether or not the test is completed for all the entries (Step S14).

In Step S14, when it is determined that the test is completed for all the entries (YES in Step S14), the test circuit 100 ends the process (end).

In Step S14, when it is determined that the test is not performed on all entries (NO in Step S14), the test circuit 100 returns to Step S0 and repeats the above process until the test is completed for all the entries.

By this process, the test circuit 100 performs the retention characteristic test of the potential of the match line while performing the parity check. In this way, it is also possible to test the match line ML whose retention characteristics of the potential are degraded due to aging of the match line ML or other reasons, after shipping. In other words, the test circuit 100 determines whether or not relief is available by using the match line retention circuit 50. When relieve is not available, the test circuit 100 provides relief by using the redundant memory. In this way, it is possible to relieve from error due to poor retention characteristics of the potential of the match line. Further, when relief is available by using the match line retention circuit 50 based on this method, the redundant memory is not used. In this case, it is also possible to reduce the capacity of the redundant memory and to achieve a reduction in size.

Seventh Embodiment

The sixth embodiment has described the case of performing the retention characteristic test of the potential of the match line while performing the parity check. However, it is also possible to perform this test when the data is stored in the search memory.

Figure 15:
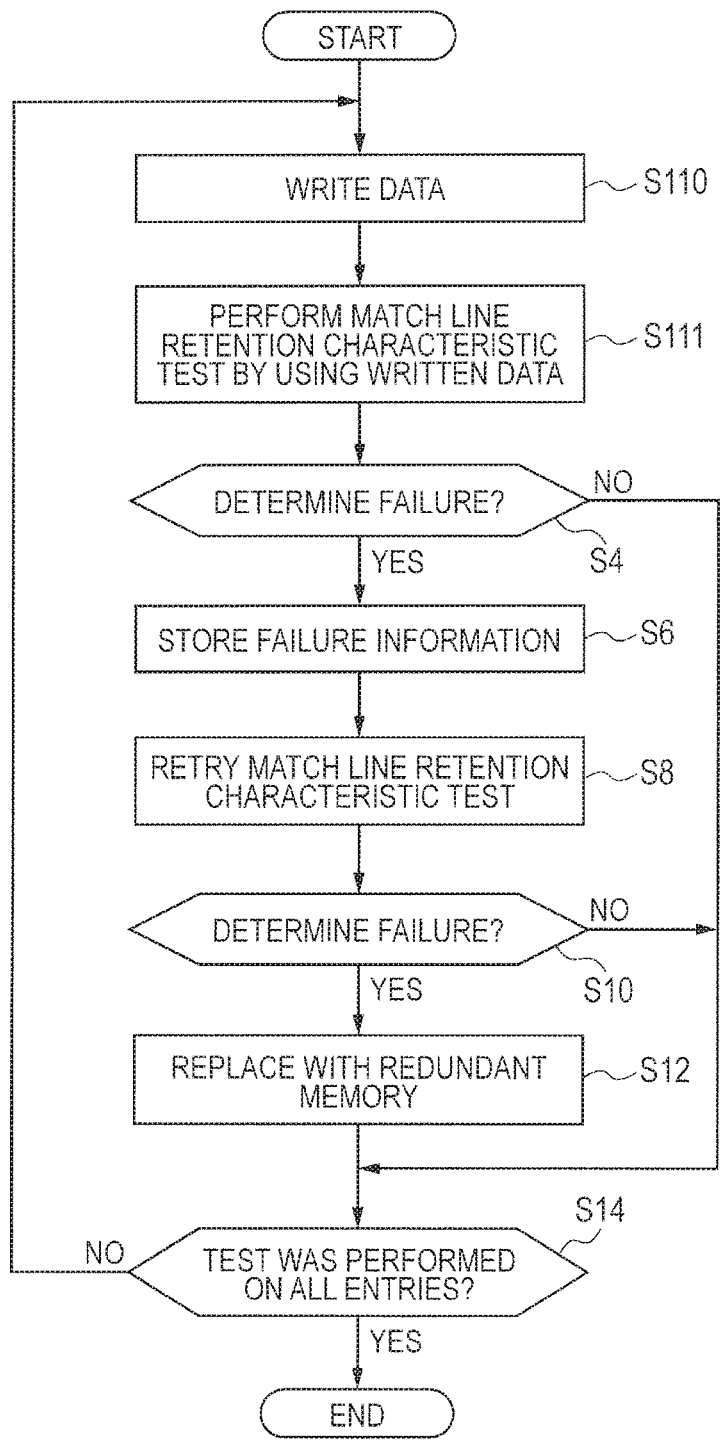
FIG. 15 is a flow chart showing the test operation in the test circuit 100 based on a seventh embodiment.

FIG. 15 is a flow chart showing the test operation in the test circuit 100 based on a seventh embodiment.

Referring to FIG. 15, the test circuit 100 performs data writing (Step S110).

For example, the test circuit 100 instructs the entries of the segment 12 to perform data writing.

Next, the test circuit 100 performs a retention characteristic test of the potential of the match line based on the written data (Step S111).

More specifically, the test circuit 100 performs a search operation with the data written for each entry as search data.

When the match amplifier MA corresponding to the entry of the written data outputs match ("H" level), the test circuit 100 determines that the match line ML corresponding to the particular entry is good. On the other hand, when the match amplifier MA outputs mismatch ("L" level), the test circuit 100 determines that the match line ML corresponding to the particular entry is failed.

The test circuit 100 determines whether or not the match line ML is failed by search operation (Step S4).

In Step S4, when it is determined that the match line ML is not failed (NO in Step S4), the test circuit 100 proceeds to Step S14.

On the other hand, in Step S4, when it is determined that the match line ML is failed (YES in Step S4), the test circuit 100 stores the failure information (Step S6). More specifically, the test circuit 100 stores the data of "1" in the dummy memory cell DMC included in the corresponding entry.

Next, the test circuit 100 retries the retention characteristic test of the potential of the match line (Step S8).

More specifically, when the match amplifier MA corresponding to the particular entry of the written data outputs match ("H" level), the test circuit 100 determines that the match line ML corresponding to the entry is good. On the other hand, when the match amplifier MA outputs mismatch ("L" level), the test circuit 100 determines that the match line ML corresponding to the particular entry is failed. Note that, in this case, the data of "1" is stored in the dummy memory cell DMC, so that the match line retention circuit 50 functions and operates as described in the first embodiment.

Next, the test circuit 100 determines whether or not the match line ML is failed (Step S10).

In Step S10, when it is determined that the match line ML is not failed (NO in Step S10), the test circuit 100 proceeds to Step S14.

On the other hand, in Step S10, when it is determined that the match line ML is failed (YES in Step S10), the test circuit 100 replaces the match line ML with a redundant memory (Step S12). More specifically, because the entry is failed and unable to be relieved even by using the match line retention circuit 50, the test circuit 100 relieves it by using the redundant memory.

Next, the test circuit 100 determines whether or not the test is completed for all the entries (Step S14).

In Step S14, when it is determined that the test is completed for all the entries (YES in Step S14), the test circuit 100 ends the process (end).

In Step S14, when it is determined that the test is not completed for all the entries (NO in Step S14), the test circuit 100 returns to Step S110 and repeats the above process until the test is completed for all the entries.

By this process, the retention characteristic test of the potential of the match line is performed also in data writing. In this way, before and after shipping, it is possible to perform the test also on the match line ML whose retention characteristics of the potential are degraded due to aging of the match line ML or other reasons. In other words, the test circuit 100 checks whether or not relief is available by using the match line retention circuit 50, and when relieve is not available, provides relief by using the redundant memory. In this way, it is possible to relieve from error due to poor retention characteristics of the potential of the match line.

Further, when relief is available by using the match line retention circuit 50 based on this method, the redundant memory is not used. In this case, it is also possible to reduce the capacity of the redundant memory and to achieve a reduction in size.

Note that this test is not necessarily performed each time data is written and may be performed at a predetermined timing.

Note that this example has described the method for performing the test by providing the test circuit 100 within the search memory. However, the test circuit 100 is not necessarily provided within the search memory, and may be provided outside the search memory to cooperate with the search memory. Further, the test function of the test circuit 100 may be given to the transfer control circuit 4 described in FIG. 1, or may be performed by the CPU2.

The present disclosure has been described in detail based on preferred embodiments. However, it is needless to say that the present disclosure is not limited to the particular embodiments and can be modified without departing from the scope of the disclosure.

What is claimed is:

1. A semiconductor device comprising:
 a plurality of search memory cells arranged in a matrix;
 a plurality of match lines provided corresponding to each memory cell row to determine match/mismatch between data stored in the search memory cell and search data;
 a match amplifier configured to precharge the match lines;
 a plurality of match line retention circuits provided corresponding to each of the match lines, each of the match line retention circuit being configured to improve a retention characteristic of the corresponding match line;
 a storage configured to store control data corresponding to each of the match lines, each piece of the control data indicating whether to activate the corresponding match line retention circuit regardless of voltage of the corresponding match line;
 a selection circuit configured to activate the match line retention circuits based on the control data stored in the storage;

a power supply line for supplying power supply voltage, wherein each of the match line retention circuits includes a capacitance element, and wherein the selection circuit includes:

a first switch for electrically coupling the capacitance element and the corresponding match line based on the control data stored in the storage; and a second switch that operates in a complementary manner to the first switch to electrically couple the capacitance element and the power supply line, based on the control data stored in the storage.

2. The semiconductor device according to claim 1, wherein the storage comprises a register that stores the control data.

3. The semiconductor device according to claim 1, wherein part of the search memory cells is used as the storage.

4. The semiconductor device according to claim 1, wherein the search memory cells are divided into a plurality of search units arranged in a matrix, wherein the match lines, the match line retention circuits, and the selection circuit are provided for each search unit, and wherein, of the search units, the storage is commonly provided corresponding to search units of the same row.

5. The semiconductor device according to claim 1, wherein each of the match line retention circuits includes:

a switch that is provided between power supply voltage and the corresponding match line and is activated in response to a selection signal from the selection circuit; and a timing adjustment circuit for adjusting a timing at which the switch is activated based on the voltage of the corresponding match line.

6. The semiconductor device according to claim 1, further comprising a test circuit for testing a state of the match lines, wherein the test circuit stores the control data in the storage based on a test result of the test circuit.

7. The semiconductor device according to claim 6, wherein the search memory cells have a redundant search memory cell used as replacement of part of the search memory cells based on the test result.

8. The semiconductor device according to claim 6, wherein the test circuit reads data stored in the memory cells to test the state of the match line with the read data as the search data.

9. The semiconductor device according to claim 6, wherein the test circuit writes data in the memory cells to test a retention characteristic of the match line with the written data as the search data.

10. The semiconductor device according to claim 1, wherein each of the match line retention circuits charges the corresponding match line based on a selection signal from the selection circuit.

11. The semiconductor device according to claim 1, wherein each of the match line retention circuits is provided between a power supply voltage and a corresponding match line, the match line retention circuit coupling the corresponding match line to the power supply voltage based on a selection signal from the selection circuit as well as a potential of the corresponding match line.

* * * * *